United States Patent
Schwerman et al.

(10) Patent No.: US 11,101,644 B2
(45) Date of Patent: Aug. 24, 2021

(54) SINGLE EVENT LATCH-UP PROTECTION FOR FAULT CURRENT RESIDING INSIDE THE NORMAL OPERATING CURRENT RANGE

(71) Applicant: HONEYWELL INTERNATIONAL INC., Morris Plains, NJ (US)

(72) Inventors: Paul W. Schwerman, Phoenix, AZ (US); George M. Brown, Jr., Peoria, AZ (US); Richard L. Marshall, Glendale, AZ (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 374 days.

(21) Appl. No.: 16/279,580

(22) Filed: Feb. 19, 2019

(65) Prior Publication Data

US 2020/0266622 A1    Aug. 20, 2020

(51) Int. Cl.
*H02H 9/02* (2006.01)
*H03K 19/003* (2006.01)

(52) U.S. Cl.
CPC ....... *H02H 9/025* (2013.01); *H03K 19/00315* (2013.01)

(58) Field of Classification Search
CPC ... H02H 9/025; H02H 5/005; H03K 19/00315
USPC .......................................................... 361/87
See application file for complete search history.

(56) References Cited

U.S. PATENT DOCUMENTS

| | | | |
|---|---|---|---|
| 6,064,555 | A | 5/2000 | Czajkowski et al. |
| 6,232,985 | B1 | 5/2001 | Chase et al. |
| 7,310,211 | B2 | 12/2007 | Gruber et al. |
| 7,492,560 | B2 | 2/2009 | Hussein et al. |
| 7,649,726 | B2 | 1/2010 | Castro |
| 8,040,652 | B2 | 10/2011 | Forghani-Zadeh et al. |
| 8,638,135 | B2 | 1/2014 | Camarena et al. |
| 9,322,865 | B2 | 4/2016 | Wylie et al. |
| 9,793,899 | B1 | 10/2017 | Maillard et al. |

(Continued)

OTHER PUBLICATIONS

Sexton, Fred, "Destructive Single-Event Effects in Semiconductor Devices and ICs," IEEE Transactions on Nuclear Science, vol. 50, N. 3, Jun. 2003.

(Continued)

*Primary Examiner* — Kevin J Comber
(74) *Attorney, Agent, or Firm* — Lorenz & Kopf, LLP

(57) ABSTRACT

Embodiments of a single event latch-up (SEL) protection circuit are provided, including: a first circuitry block coupled to a source of an input voltage a load, and digitally controlling a first switch; the first switch generates a load and senses an instantaneous load current iLoad. A second circuitry block is configured to generate an average iLoad and generate single event latch-up triggers (i.e., SEL fault detection) as a function of at least a comparison of the inst_iLoad and average iLoad; wherein this first circuitry block contains the analog based SET filtering needed to reduce false SEL triggers. A supervisor module generates on/off commands for the first switch, responsive to receiving the SEL detection in excess of a preprogrammed delay to provide the final SET filtering to prevent false SEL triggers. The first circuitry block removes the load voltage at N1 upon receiving an off command from the supervisor module.

20 Claims, 4 Drawing Sheets

(56) References Cited

U.S. PATENT DOCUMENTS

| | | | |
|---|---|---|---|
| 9,819,258 B1 | 11/2017 | Vandam et al. | |
| 9,928,143 B2 | 3/2018 | Dickey et al. | |
| 2017/0033554 A1* | 2/2017 | Vail | H02H 5/005 |
| 2017/0237250 A1* | 8/2017 | Chang | H02H 3/44 |
| | | | 361/87 |
| 2018/0159317 A1 | 6/2018 | Mirabella et al. | |
| 2018/0248351 A1 | 8/2018 | Vail et al. | |
| 2018/0252750 A1 | 9/2018 | Danesh et al. | |
| 2018/0302080 A1 | 10/2018 | Terenzi et al. | |

OTHER PUBLICATIONS

McHale, John, "Fly Me to the Moon . . . and the Space Station, too." Military & Aerospace Electronics, https://www.militaryaerospace.com/articles/print/volume-18/issue-6/features/special-report/lsquofly-me-to-the-moonx2026rsquo-and-the-space-station-too.html, printed on Oct. 26, 2018.

* cited by examiner

ID UP PROTECTION
FOR FAULT CURRENT RESIDING INSIDE
THE NORMAL OPERATING CURRENT
RANGE

STATEMENT REGARDING FEDERALLY SPONSORED RESEARCH OR DEVELOPMENT

This invention was made with Government support under NNJ06TA25C NASA Johnson Space Center. The Government may have certain rights in this invention.

TECHNICAL FIELD

The technical field generally relates to electrical circuit latch-up protection, and more particularly relates to single event latch-up protection for fault current residing inside the normal operating current range.

BACKGROUND

One characterization of many load devices is the current that it draws (often referred to as load current) while it is actively receiving power. In an application, a power supply is selected that can meet voltage specifications and for which its normal operating range of load current can accommodate any expected swings in load current during operation of the load device. In these scenarios, generalized fault protection may be provided by a current limiting solution designed to trip at some amount of current margin over a maximum load current of the power supply. When the current limiter trips, further protective actions may take place.

However, a variety of load devices, such as a liquid crystal display (LCD) element, are vulnerable to a fault phenomenon referred to as a single event latch-up (SEL) that occurs at a load current under the maximum load current. SEL is different than Single Event Transients (SET) in that SEL is a latching, sometimes destructive, change in state of a circuit or device and SET is a self-correcting unwanted change in state of a circuit or device. Upon occurrence of a SEL fault, the load device draws a fault current that is greater than a maximum step load current of the power supply, but less than the maximum load current. A SEL is a technical problem in scenarios in which the SEL renders a load device unusable. Since the SEL fault has fault current that resides within the normal operating current range, common current limiting solutions do not sufficiently detect and protect a load device from a SEL that draws less current than the device's maximum normal operating current.

Accordingly, the embodiments provided propose technical solutions to the technical problem of detecting SEL faults. The following disclosure provides technological enhancements over commonly available fault protection solutions, in addition to addressing related issues.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

Provided is a single event latch-up (SEL) detection circuit, including: a first circuitry block coupled to a source of an input voltage V1, the first circuitry block configured to (i) receive the input voltage V1, a digital enable signal L_en, and an on command, and to control a gate voltage (Vgate) as a function of the input voltage V1, the digital enable signal L_en, and an on command, and (ii) sense an instantaneous load current, inst_iLoad at a node N2; a first switch configured to receive Vgate, and to control a load voltage at a node N1, responsive to the Vgate; a load ohmically coupled to N1; a second circuitry block coupled to the first circuitry block at N2 and configured to (i) receive V1 and inst_iLoad, (ii) generate an average iLoad, and (iii) generate a single event latch-up trigger (SEL_T) at a node N3, the SEL_T being a function of at least a comparison of the inst_iLoad and average iLoad; a supervisor module coupled between the second circuitry block at N3 and the first circuitry block, the supervisor module configured to receive the SEL_T, and generate an off command when the SEL_T remains asserted a preprogrammed delay after the receipt of the SEL_T; and wherein the first circuitry block is further configured to remove the load voltage at N1 upon receiving an off command.

Another single event latch-up (SEL) protection circuit is provided. It includes: a first circuitry block coupled to a source of an input voltage V1, the first circuitry block configured to (i) receive the input voltage V1, a digital enable signal L_en, and an on command, and to control a gate voltage (Vgate) as a function of the input voltage V1, the digital enable signal L_en, and an on command, and (ii) sense an instantaneous load current, inst_iLoad at a node N2; a first switch configured to receive Vgate, and to control a load voltage at a node N1, responsive to the Vgate; a load ohmically coupled to N1; a second circuitry block coupled to the first circuitry block at N2 and configured to (i) receive V1 and inst_iLoad, (ii) generate an average iLoad, and (iii) generate a single event latch-up trigger (SEL_T) at a node N3, the SEL_T being a function of at least a comparison of the inst_iLoad and average iLoad; a supervisor module coupled between the second circuitry block at N3 and the first circuitry block, the supervisor module configured to receive the SEL_T, and generate an off command responsive after the elapse of either a first digitally programmed delay or a second digitally programmed delay; and wherein the first circuitry block removes the load voltage at N1 upon receiving an off command.

Furthermore, other desirable features and characteristics of the system and method will become apparent from the subsequent detailed description and the appended claims, taken in conjunction with the accompanying drawings and the preceding background.

BRIEF DESCRIPTION OF THE DRAWINGS

The present application will hereinafter be described in conjunction with the following drawing figures, wherein like numerals denote like elements, and.

DETAILED DESCRIPTION

Figure 1:
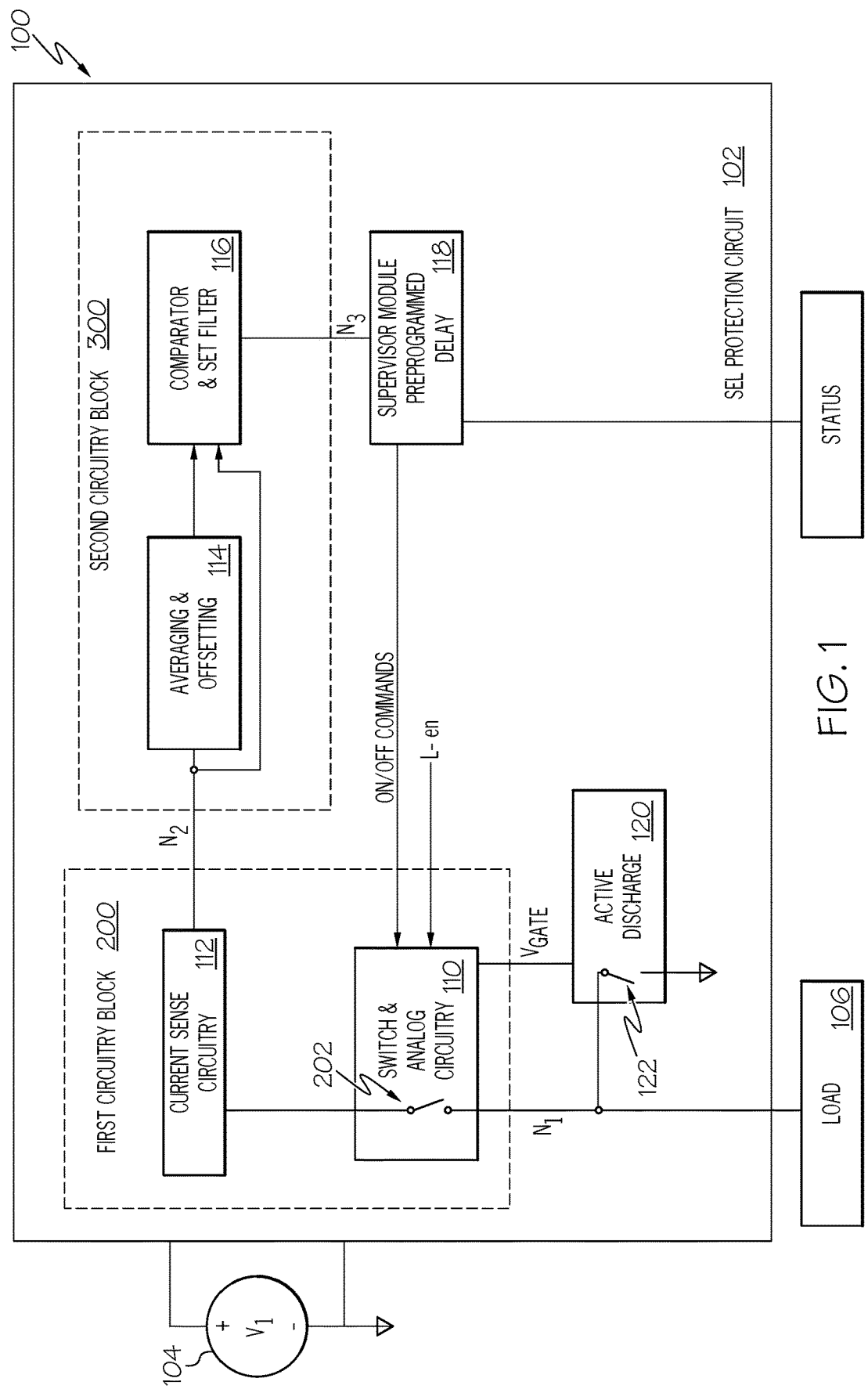
FIG. 1 depicts a simplified functional block diagram of a single event latch-up (SEL) protection circuit coupled to a load, in accordance with an exemplary embodiment.

The following detailed description is merely illustrative in nature and is not intended to limit the embodiments of the subject matter or the application and uses of such embodiments. As used herein, the word "exemplary" means "serving as an example, instance, or illustration." Thus, any embodiment described herein as "exemplary" is not necessarily to be construed as preferred or advantageous over other embodiments. The embodiments described herein are exemplary embodiments provided to enable persons skilled in the art to make or use the invention and not to limit the scope of the invention that is defined by the claims. Furthermore, there is no intention to be bound by any expressed or implied theory presented in the preceding technical field, background, summary, or the following detailed description.

As mentioned, a liquid crystal display (LCD) element is one of a variety of load devices, that are vulnerable to single event latch-up (SEL). A SEL can render a load device, such as a LCD element, permanently unusable. When the fault current associated with a SEL is inside the normal operating current range specified for the power supply, in that it falls below a specified maximum load current of the power supply, the load cannot be protected with a simple current limit. When the SEL current is larger than a maximum step load specified for the power supply, the fault can be detected and corrected. The embodiments of a proposed SEL protection circuit are directed to detecting SEL fault current within the normal operating current range, and removing power from the load device responsive to the detected SEL current. After a sufficient delay for removing or drawing down the power to the load device, the power may again be made available to the load device.

In an example described below, an input power supply of 5 volts and a load device that is a LCD is considered. In the example, single event latch-ups occur when load current on the 5-volt power supply increases in a 0.6 Amp increment, and represents the upper step load current where the protection must trip for the LCD. In operation, the LCD may cause a step load current of 0.4 A; therefore, this is a lower current limit for which the desired SEL detector circuit must not trip. In operation, a 0.6 A single event latch-up can result in a total current draw that is less than the maximum allowed current draw of the LCD. Embodiments of the provided solution are directed to this technical problem. The provided solution senses and averages load current drawn by the 5V LCD and offsets it by 0.5 A to trip a single event latchup trigger (SEL detection). The provided solution implements a field effect transistor (FET) as a switch for generating (i.e., providing) and removing power to the LCD. Other features and additional details are provided below. Although the below described embodiments refer to a 5 volt power supply and 5 V LCD, it is understood that the concepts presented herein may be scaled for other similar applications.

Referring to FIG. 1, a simplified functional block diagram of a SEL detection circuit 100 depicts an embodiment of a SEL protection circuit 102, ohmically coupled between a main electrical power supply (also referred to as a source of input voltage), V1 104, and a load device that is susceptible to SEL, load 106. In various embodiments, the main power supply V1 104 is a 5-volt supply. The SEL protection circuit 102 includes a first circuitry block 200, a second circuitry block 300, and a supervisor module 118. In some embodiments, the SEL protection circuit 102 includes an active discharge circuitry 120. The SEL protection circuit 102 is configured to generate and control a load voltage at node N1, to which load 106 may be ohmically coupled for the operation of the load 106. The electrical power supply V1 104 and the load 106 may each be variously implemented, and may be DC or AC, as needed. In various embodiments, any combination of V1 104, SEL protection circuit 102, and load 106 may share a common ground signal.

Figure 2:
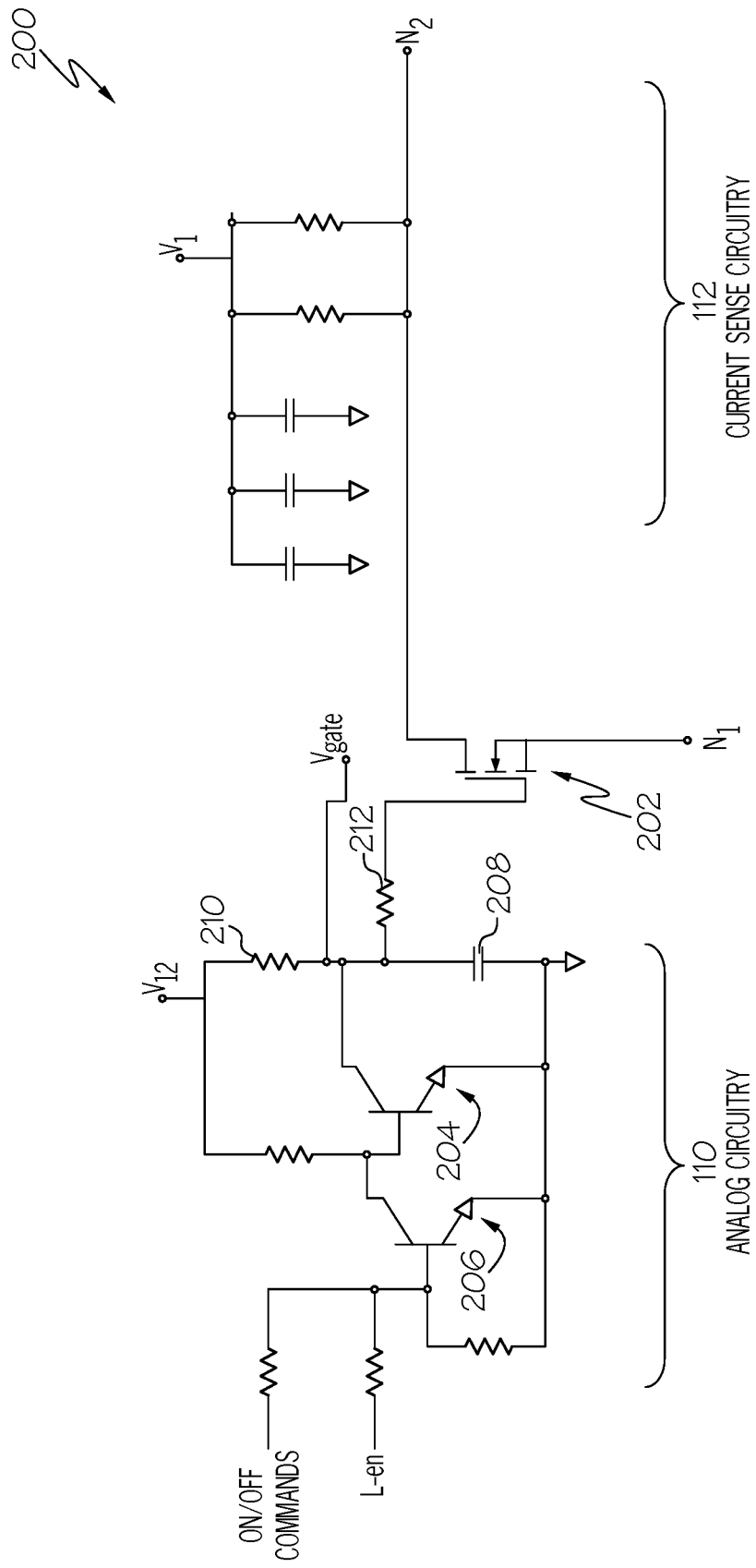
FIGS. 2-4 depict detailed schematic representations of an embodiment of a SEL protection circuit, in accordance with an exemplary embodiment.

Turning now to FIG. 2, and with continued reference to FIG. 1, first circuitry block 200 includes current sense circuitry 112 and first switch 202 and analog circuitry 110. The first circuitry block 200 is coupled to V1 104, and configured to receive as inputs, the input voltage V1, a digital load enable signal (L_en), and on/off commands. As used herein, the on/off command is substantially digital; when it is asserted, it is an "on" command, and when it is deasserted, it is an "off" command. The first circuitry block 200 is configured to (i) receive, as inputs, the input voltage V1 104, a digital enable signal L_en, and an on command, and to control a gate voltage (Vgate) as a function of the input voltage V1, the digital enable signal L_en, and an on command, and (ii) sense an instantaneous load current, inst_iLoad at a node N2. Accordingly, the switch 202 is controlled in part by digital logic.

The first switch 202 is configured to receive Vgate, and to control a load voltage at a node N1, responsive to the Vgate. Therefore, the first circuitry block 200 controls the load voltage at N1 by generating the load voltage (i.e., making it available) at N1 responsive to an on command and the digital load enable (L_En) and by removing the load voltage at N1 upon receiving an off command (or, detected that the "on" command is deasserted). As referred to herein, removing the load voltage at N1 means substantially pulling the load voltage at N1 to zero volts.

In operation, the first circuitry block 200 is configured to, responsive to power asserted at V1 104, control the load voltage by holding the load voltage at N1 low until receiving a high (i.e., asserted) L_en; and, responsive to the L_En being asserted, provide the load voltage at N1. In operation of the load 106, the operating, instantaneous current inst_i-Load fluctuates. The sensed inst_iLoad is available at node N2 for further processing by the second circuitry block 300.

Although the switch 202 is controlled in part by digital logic, the load voltage at N1 is not. The analog circuitry 110 is configured to receive the on/off commands and the L_en, and control Vgate, hence the opening and closing of the switch 202, and to create a controlled rise time of the load voltage, such that the load voltage at N1 rises from substantially zero volts to fully asserted load voltage (for example, 5 volts) in accordance with rise time requirements of the load device 106. Further, the analog circuitry 110 may be configured to limit the step load current on the main power supply V1 104.

In an embodiment of the analog circuitry 110, a first bipolar transistor 204 is coupled to a gate node (Vgate) of the FET 202 on its collector terminal and directly connected to ground on its emitter terminal. A resistor 210 is connected between a twelve-volt power supply (V12) and Vgate, and a capacitor 208 couples Vgate to ground. A resistor 212 may be connected on a first terminal to Vgate and on a second terminal to the Vgate of FET 202. When L_en goes low, a fast discharge of the capacitor 208 is affected by bipolar transistor 204 and a bipolar transistor 206. The bipolar transistor 206 is directly connected to the base of the bipolar transistor 204 on its collector terminal and directly connected to ground on its emitter terminal. The base of the bipolar transistor 206 is controlled by the L_en and on/off commands.

In the embodiment of FIG. 2, the current sense circuitry 112 embodies two or more capacitors in parallel between V1 104 and ground. Additionally, the current sense circuitry 112 embodies a resistor between V1 104 and N2. In an embodiment, the current sense circuitry comprises three capacitors in parallel between V1 104 and ground, and two resistors in parallel between V1 104 and N2.

Figure 3:
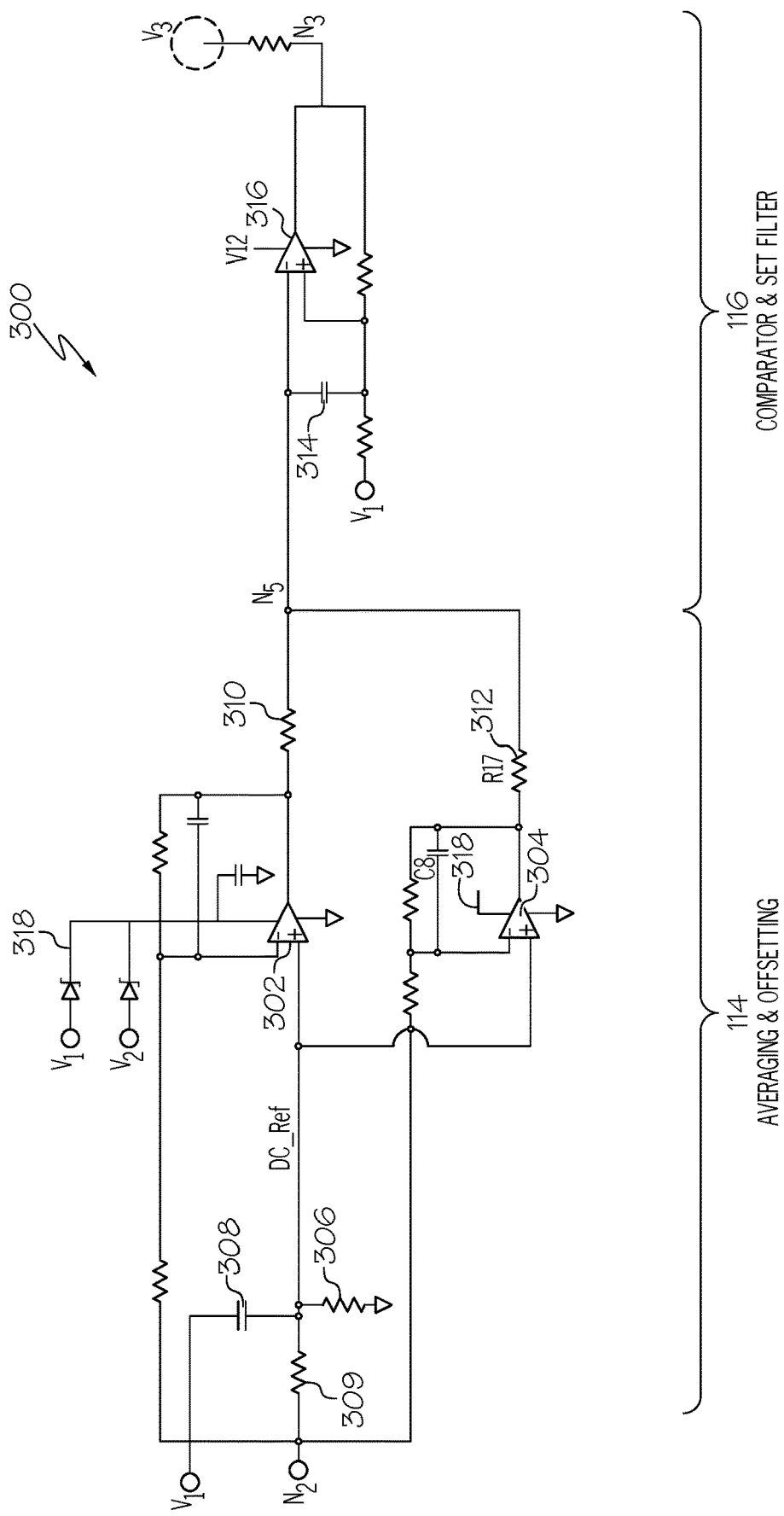

Turning now to FIG. 3, and with continued reference to FIGS. 1-2, an embodiment of the second circuitry block 300 is shown, including an averaging and offsetting circuitry 114, and a comparator and single event latch-up trigger (SET) filter 116. Generally, the second circuitry block 300 is coupled to the first circuitry block 200 at a node N2 and configured to (i) receive V1 and inst_iLoad, (ii) average the inst_iLoad to thereby generate an average iLoad, and (iii) generate single event latch-up triggers (SEL_Ts) (i.e., SEL fault detection) at a node N3, the SEL_Ts being a function of a comparison of the inst_iLoad and average iLoad.

Within the averaging and offsetting circuitry 114, resistor 309 and capacitor 308 are configured to provide the averaging of the sensed current inst_iLoad. A first terminal of resistor 309 and capacitor 308 are connected at a node DC_Ref. A second terminal of capacitor 308 is directly connected to V1 104, and a second terminal of resistor 309 is directly connected at node N2. Resistor 306 is connected at DC_Ref, and directly grounded on its second terminal. Resistor 306 and resistor 309 provide a first offset at DC_Ref. In various embodiments, an amplifier 302 and 304 may be used to boost the averaged current at DC_Ref to the average iLoad for comparing it to the instantaneous load current inst_iLoad. In various embodiments, the SET filter in the comparator and SET filter 116 consists of entirely analog circuitry, and the output at node N3 (SEL_T) is generated completely in the analog domain. In other embodiments, the SET filter in the comparator and SET filter 116 includes digital circuitry and the SEL_T is generated completely in the digital domain.

Concisely, in an embodiment, the second circuitry block 300 employs a first operational amplifier 302 and a second operational amplifier 304, each configured to compare the average Load to the inst_iLoad, wherein output signals from the first and second operational amplifier are ohmically coupled and attenuated with an analog filter to thereby generate a gain-out signal at node N5. The second circuitry block 300 generates the SEL Fault Detection (SEL_T) as a function of the gain_out signal at N5. As alluded to, detecting a fault current that is attributed to a SEL embodies an offset by an amount of current representative of the step load current of the power supply V1 104 (for example, by 0.5 Amps); therefore, circuit elements within the second circuitry block 300 are selected to have performance specifications sufficient for tripping the other components to cause a SET.

More specifically, in an embodiment of the second circuitry block 300 shown in FIG. 3, two operational amplifiers (302 and 304) are configured to compare the average iLoad to the inst_iLoad. Reference voltages (318) for the operational amplifiers 302 and 304 are selected to reflect anticipated deviations in the inst_iLoad with respect to the average iLoad. Since each of the two operational amplifiers (302 and 304) is likely to have its own response indicating a SET, their separate responses are filtered using resistor 310, resistor 312, and capacitor 314. This filter configuration attenuates their separately generated responses to a SET and provides a gain output (gain_out) at a node N5 that is compared to V1 104 with an operational amplifier 316. The output of operational amplifier 316 is directly coupled to node N3 and may be coupled to a third voltage source V3. Node N3 is the node that supplies the SEL Fault detection signal to the module 118, from which the supervisor module 118 makes determinations and causes the on/off commands to toggle.

The supervisor module 118 is ohmically coupled between the second circuitry block 300 at N3 and the first circuitry block 200, and is configured to monitor N3 to detect or receive the SEL Fault Detection signal (SEL_T) and to generate therefrom the on/off commands. The supervisor module 118 is configured to employ a digital preprogrammed delay upon receipt of the SEL_T. In an embodiment, after receiving the analog based SEL_T, the supervisor module 118 restarts a timer of the magnitude of the preprogrammed delay. When the preprogrammed delay elapses after the analog SEL_T, the supervisor module 118 may generate a digital SEL_T. In an embodiment, when the preprogrammed delay elapses after the analog SEL_T, the supervisor module 118 generates an "off" command responsive to the co-occurrence of the analog SEL_T being asserted and the digitally generated SEL_T being asserted.

In another embodiment, when the preprogrammed delay elapses after the analog SEL_T, the supervisor module 118 generates an "off" command if the analog SEL_T is still being asserted. In another embodiment, a second digital pre-programmed delay is employed, and when the second digital preprogrammed delay elapses after the analog SEL_T, the supervisor module 118 generates an "off" command if the analog SEL_T is still being asserted. In another embodiment, the supervisor module 118 employs a second digital preprogrammed delay, and each time a SEL_T is received/detected, the supervisor selects between the first and second digital preprogrammed delay to use for the timer.

In generating the on/off commands, the supervisor module 118 performs the tasks of (i) restarting a timer to the preprogrammed delay responsive to receiving a fault detection signal, and (ii) waiting/monitoring the SEL_T for the duration of the elapse of the preprogrammed SET delay. As provided by the invention, when the SEL_T signal remains asserted until the elapse of the digital preprogrammed delay, this indicates that the inst_iLoad is greater than a step load of the source of the input voltage V1, for which it is desirable to remove power from the load (i.e., remove the load voltage at N1). Upon removal of the power to the load, a preprogrammed recovery delay elapses after which the supervisor module 118 generates an "on" command.

Figure 4:
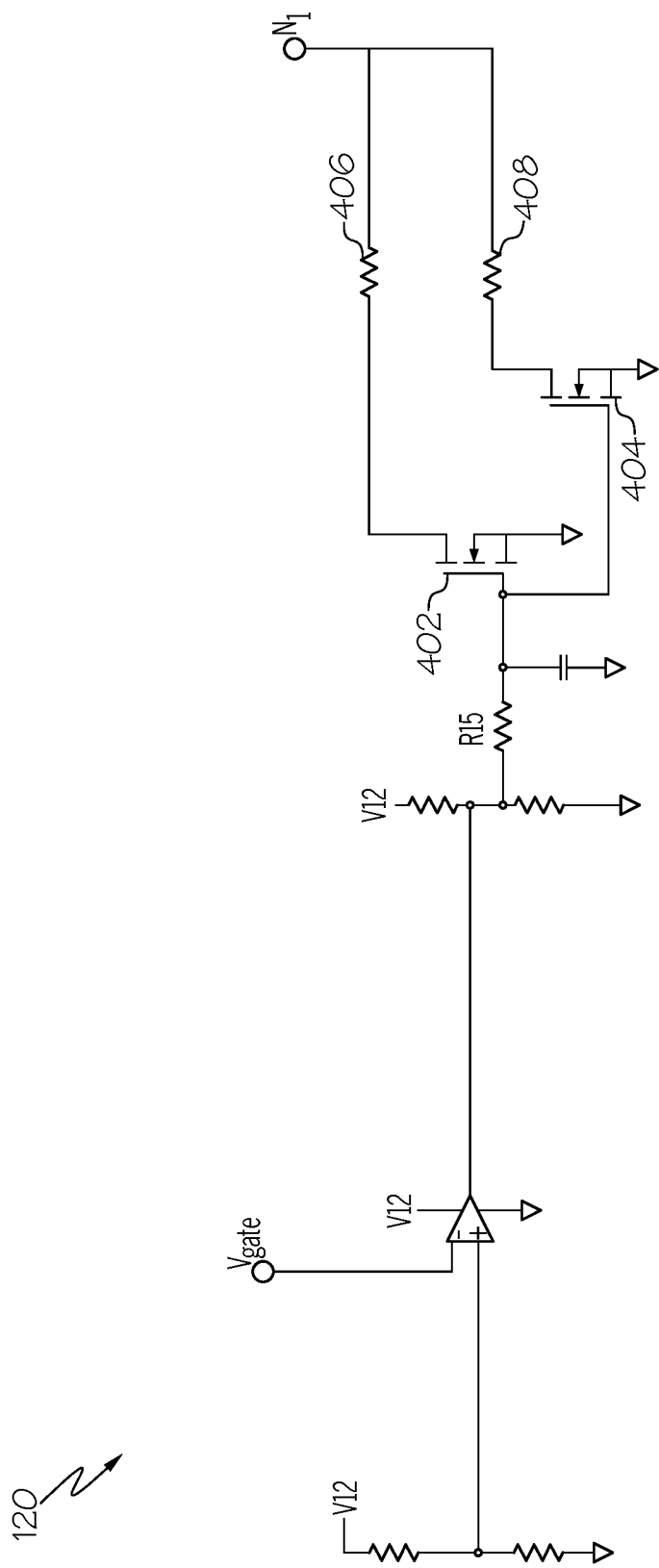

In some embodiments, the power N1 must be turned off quickly to protect the load 106, such as when load 106 is a LCD. Therefore, in some embodiments, in addition to simply removing power at N1, active discharge circuitry 120 assists in turning the switch 202 off quickly. In an embodiment, active discharge circuitry 120 employs a switch 122 configured to actively drain current away from N1 when switch 202 is off. In practice, this active discharge is a function of the Vgate, a proxy for the gate voltage of switch 202. Turning to FIG. 4 and with continued reference to FIGS. 1-3, in various embodiments, switch 122 is implemented as two FETs in parallel: switch 402 and switch 404. Each of switch 402 and switch 404 has its drain ohmically connected to N1 and its source grounded. The gates of switch 402 and switch 404 are activated responsive to the sensed Vgate, representing whether the power to the load 106 is on (generated) or off. Resistor 406 is directly connected on a first terminal to the drain of FET 402 and directly connected at N1 on a second terminal. Resistor 408 is directly connected on a first terminal to the drain of FET 404 and directly connected at N1 on a second terminal.

As mentioned, the supervisor module 118 generates the on/off commands. The supervisor module 118 may be implemented a variety of ways. In an embodiment, the supervisor module 118 may include a SET monitor program that includes parameters, rules and instructions which, when executed by a processor, performs the functions associated with the operation of the supervisor module 118. In an embodiment, the supervisor module 118 can be configured to generate and/or report a status of the protected load to both internal and external monitoring functions. Additionally, the supervisor module 118 may be configured to not respond to a SEL_T during an initial power up sequence of a system that it resides in and/or during a reapplication of power to the load.

Thus, the provided systems and methods propose technical solutions to the technical problem of detecting SEL faults. The described embodiments provide technological enhancements over commonly available fault protection solutions.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate the interchangeability of hardware and software, various illustrative components, blocks, modules, circuits, and steps have been described above generally in terms of their functionality. Whether such functionality is implemented as hardware or software depends upon the application and design constraints imposed on the overall system.

Skilled artisans may implement the described functionality in varying ways for each application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

Further, the various illustrative logical blocks, modules, and circuits described in connection with the embodiments disclosed herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of the method or algorithm described in connection with the embodiments disclosed herein may be embodied directly in hardware, in a software module executed by a controller or processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. When "or" is used herein, it is the logical or mathematical or, also called the "inclusive or." Accordingly, A or B is true for the three cases: A is true, B is true, and, A and B are true. In some cases, the exclusive "or" is constructed with "and;" for example, "one from A and B" is true for the two cases: A is true, and B is true.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A single event latch-up (SEL) detection circuit, comprising:
a first circuitry block coupled to a source of an input voltage V1, the first circuitry block configured to (i) receive the input voltage V1, a digital enable signal L_en, and an on command, and to control a gate voltage (Vgate) as a function of the input voltage V1, the digital enable signal L_en, and an on command, and (ii) sense an instantaneous load current, inst_iLoad at a node N2;
a first switch configured to receive Vgate, and to control a load voltage at a node N1, responsive to the Vgate;
a load ohmically coupled to N1;
a second circuitry block coupled to the first circuitry block at N2 and configured to (i) receive V1 and inst_iLoad, (ii) generate an average load current (iLoad), and (iii) generate a single event latch-up trigger (SEL_T) at a node N3, the SEL_T being a function of at least a comparison of the inst_iLoad and average iLoad;
a supervisor module coupled between the second circuitry block at N3 and the first circuitry block, the supervisor module configured to receive the SEL_T, and generate an off command when the SEL_T remains asserted a preprogrammed delay after the receipt of the SEL_T; and wherein the first circuitry block is further configured to remove the load voltage at N1 upon receiving an off command.

2. The SEL protection circuit of claim 1, wherein the source of the input voltage V1 has a fault current that is greater than a step load current, and wherein the SEL control circuitry is further adapted to remove the load voltage at N1 for a range of iLoad between the step load current and the fault current.

3. The SEL protection circuit of claim 1, wherein the switch is implemented with at least a field effect transistor (FET) having its gate controlled by a combination of the L_en signal and the on/off commands, its drain directly connected to N2, and its source ohmically coupled to N1.

4. The SEL protection circuit of claim 3, wherein the first circuitry block comprises an analog circuitry configured to receive the L_en and to actively pull the load voltage at N1 to substantially zero volts when L_en is low, and to cease actively pulling the load voltage at N1 low responsive to L_en going high.

5. The SEL protection circuit of claim 4, wherein the second circuitry block comprises:
a first and a second operational amplifier, each configured to compare the average iLoad to the inst_iLoad; and
wherein output signals from the first and second operational amplifier are attenuated with a filter to generate the single event latch-up trigger (SEL_T) therefrom.

6. The SEL protection circuit of claim 5, wherein the supervisor module is configured to: provide a second digital preprogramed delay; and generate the off command responsive to the elapse of the second digital preprogrammed delay after receipt of the SEL_T.

7. The SEL protection circuit of claim 6, wherein, responsive to power asserted at V1, the first circuitry block is configured to:
hold the load voltage at N1 low when L_en is low; and,
generate the load voltage at N1 responsive to receiving the on command when the L_en signal is asserted and V1 is asserted.

8. The SEL protection circuit of claim 7, further comprising
active discharge circuitry coupled between N1 and ground, the active discharge circuitry including a second switch configured to actively drain current from N1 when the first switch is off.

9. The SEL protection circuit of claim 1, wherein the SEL_T is generated completely in the analog domain.

10. The SEL protection circuit of claim 1, wherein the SEL_T is generated completely in the digital domain.

11. A single event latch-up (SEL) protection circuit, comprising:
a first circuitry block coupled to a source of an input voltage V1, the first circuitry block configured to (i) receive the input voltage V1, a digital enable signal L_en, and an on command, and to control a gate voltage (Vgate) as a function of the input voltage V1, the digital enable signal L_en, and an on command, and (ii) sense an instantaneous load current, inst_iLoad at a node N2;
a first switch configured to receive Vgate, and to control a load voltage at a node N1, responsive to the Vgate;
a load ohmically coupled to N1;
a second circuitry block coupled to the first circuitry block at N2 and configured to (i) receive V1 and inst_iLoad, (ii) generate an average load current (iLoad), and (iii) generate a single event latch-up trigger (SEL_T) at a node N3, the SEL_T being a function of at least a comparison of the inst_iLoad and average iLoad;
a supervisor module coupled between the second circuitry block at N3 and the first circuitry block, the supervisor module configured to receive the SEL_T, and generate an off command responsive after the elapse of either a first digitally programmed delay or a second digitally programmed delay; and
wherein the first circuitry block removes the load voltage at N1 upon receiving an off command.

12. The SEL protection circuit of claim 11, wherein a gate of the first FET is controlled by a combination of the L_en signal and the on/off commands, its drain is directly connected to N2, and its source is ohmically coupled to N1.

13. The SEL protection circuit of claim 12, further comprising
active discharge circuitry coupled between N1 and ground, the active discharge circuitry including a second FET configured to actively drain current from N1 when the first switch is off.

14. The SEL protection circuit of claim 13, wherein the supervisor module is configured to:
receive a SEL_T from analog circuitry,
determine whether a second digitally preprogrammed SET filter delay has elapsed; and
generate the off command only responsive to receiving the second SET before the elapse of the preprogrammed delay.

15. The SEL protection circuit of claim 14, wherein the first circuitry block comprises an analog circuitry configured to receive the L_en and to actively pull the load voltage at N1 to substantially zero volts when L_en is low, and to cease actively pulling the load voltage at N1 low responsive to L_en going high.

16. The SEL protection circuit of claim 15, wherein the second circuitry block comprises:
a first and a second operational amplifier, each configured to compare the average Load to the inst_iLoad; and
wherein output signals from the first and second operational amplifier are attenuated with a filter to generate the single event latch-up trigger (SEL_T) therefrom.

17. The SEL protection circuit of claim 16, wherein, responsive to power asserted at V1, the first circuitry block is configured to:
hold the load voltage at N1 low when L_en is low; and,
generate the load voltage at N1 responsive to receiving the on command when the L_en signal is asserted and V1 is asserted.

18. The SEL protection circuit of claim 17, wherein, responsive to power asserted at V1, the first circuitry block is configured to:
hold the load voltage at N1 low when L_en is low; and,
generate the load voltage at N1 responsive to receiving the on command when the L_en signal is asserted and V1 is asserted.

19. The SEL protection circuit of claim 11, wherein the supervisor module is configured to not respond to a SEL_T during an initial power up and during a reapplication of power to the load.

20. The SEL protection circuit of claim 11, wherein the supervisor module is configured to generate a status of the load.

* * * * *